(12) United States Patent
Weber

(10) Patent No.: US 9,807,904 B2
(45) Date of Patent: Oct. 31, 2017

(54) MOUNTING FRAME AND RAIL FOR ELECTRONICS AND INSTRUMENTATION ENCLOSURE

(71) Applicant: Fibox Oy Ab, Espoo (FI)

(72) Inventor: Kenneth Weber, Karjaa (FI)

(73) Assignee: FIBOX OY AB, Espoo (FI)

( * ) Notice: Subject to any disclaimer, the term of this patent is extended or adjusted under 35 U.S.C. 154(b) by 78 days.

(21) Appl. No.: 14/901,566

(22) PCT Filed: Jun. 27, 2014

(86) PCT No.: PCT/FI2014/050534
§ 371 (c)(1),
(2) Date: Dec. 28, 2015

(87) PCT Pub. No.: WO2014/207319
PCT Pub. Date: Dec. 31, 2014

(65) Prior Publication Data
US 2016/0150669 A1    May 26, 2016

(30) Foreign Application Priority Data
Jun. 27, 2013 (FI) ...................................... 20135704

(51) Int. Cl.
*H05K 7/18* (2006.01)
*H02B 1/32* (2006.01)
(Continued)

(52) U.S. Cl.
CPC ............. *H05K 7/183* (2013.01); *H02B 1/014* (2013.01); *H02B 1/32* (2013.01); *H05K 7/14* (2013.01)

(58) Field of Classification Search
CPC ........ H05K 7/183; H05K 7/14; H05K 5/0226; H02B 1/014; H02B 1/32; H02B 1/301
(Continued)

(56) References Cited

U.S. PATENT DOCUMENTS 4,285,436 A     8/1981   Konstant et al.
4,973,110 A * 11/1990   Nyquist ................. A47B 47/03
                                                                                               108/187
(Continued)

FOREIGN PATENT DOCUMENTS

CN         101299912 A    11/2008
CN         201623370 U    11/2010
(Continued)

*Primary Examiner* — Patrick Hawn
(74) *Attorney, Agent, or Firm* — Birch, Stewart, Kolasch & Birch, LLP

(57) ABSTRACT

A mounting frame for an electronics and instrumentation enclosure includes two elongated supports joined by an elongated piece and four corner parts fastened to the ends of the elongated supports by a fastener. For the mounting frame to be easy and rapid to assemble and to mount inside the enclosure also at the mounting site, the ends of the elongated supports are provided with a locking tongue formed as one piece with the elongated support and extending away from a plane defined by the elongated supports, and through-hole for mounting are provided at the corner parts and arranged to receive the locking tongues of the elongated supports without clearance, the corner parts comprising a plural number of such mounting holes at a distance from one another in the longitudinal direction of the corner parts. An elongated support is provided for a mounting frame.

17 Claims, 2 Drawing Sheets

(51) Int. Cl.
*H05K 7/14* (2006.01)
*H02B 1/01* (2006.01)

(58) Field of Classification Search
USPC ............................... 211/26; 312/265.1, 321
See application file for complete search history.

(56) References Cited

U.S. PATENT DOCUMENTS

| | | | | |
|---|---|---|---|---|
| 5,806,820 | A * | 9/1998 | Simon | F16L 3/24 |
| | | | | 211/192 |
| 6,021,909 | A * | 2/2000 | Tang | H02B 1/36 |
| | | | | 211/183 |
| 6,098,816 | A | 8/2000 | Sonntag | |
| 6,155,434 | A | 12/2000 | Benner et al. | |
| 7,188,916 | B2 * | 3/2007 | Silvestro | A47B 88/43 |
| | | | | 312/223.1 |
| 8,033,406 | B2 * | 10/2011 | Mattlin | G06F 1/181 |
| | | | | 211/192 |
| 8,091,970 | B2 * | 1/2012 | Francisquini | H02B 1/301 |
| | | | | 211/192 |
| 8,119,909 | B2 * | 2/2012 | Sonntag | H02G 3/18 |
| | | | | 174/50 |
| 8,210,490 | B2 * | 7/2012 | Mattlin | G06F 1/181 |
| | | | | 211/192 |
| 8,309,848 | B2 * | 11/2012 | Sonntag | H02G 3/18 |
| | | | | 174/50 |
| 8,353,492 | B2 * | 1/2013 | Mattlin | G06F 1/181 |
| | | | | 211/192 |
| 8,528,872 | B2 * | 9/2013 | Mattlin | G06F 1/181 |
| | | | | 211/192 |
| 9,155,220 | B2 * | 10/2015 | Yokosawa | H05K 7/1489 |
| 9,257,824 | B2 * | 2/2016 | Laye | H02G 3/16 |
| 9,456,520 | B1 * | 9/2016 | Wilson | H05K 7/1488 |
| 9,627,860 | B2 * | 4/2017 | Proserpio | H02B 1/012 |
| 2008/0272071 | A1 | 11/2008 | Sonntag | |
| 2014/0262489 | A1 * | 9/2014 | Laye | H02B 1/32 |
| | | | | 174/541 |

FOREIGN PATENT DOCUMENTS

| | | |
|---|---|---|
| DE | 2951806 A1 | 7/1980 |
| DE | 19647802 C1 | 1/1998 |
| FI | 116028 B | 8/2005 |
| GB | 2450558 A | 12/2008 |
| GB | 2484222 A | 4/2012 |
| WO | WO 2009/045468 A1 | 4/2009 |

* cited by examiner

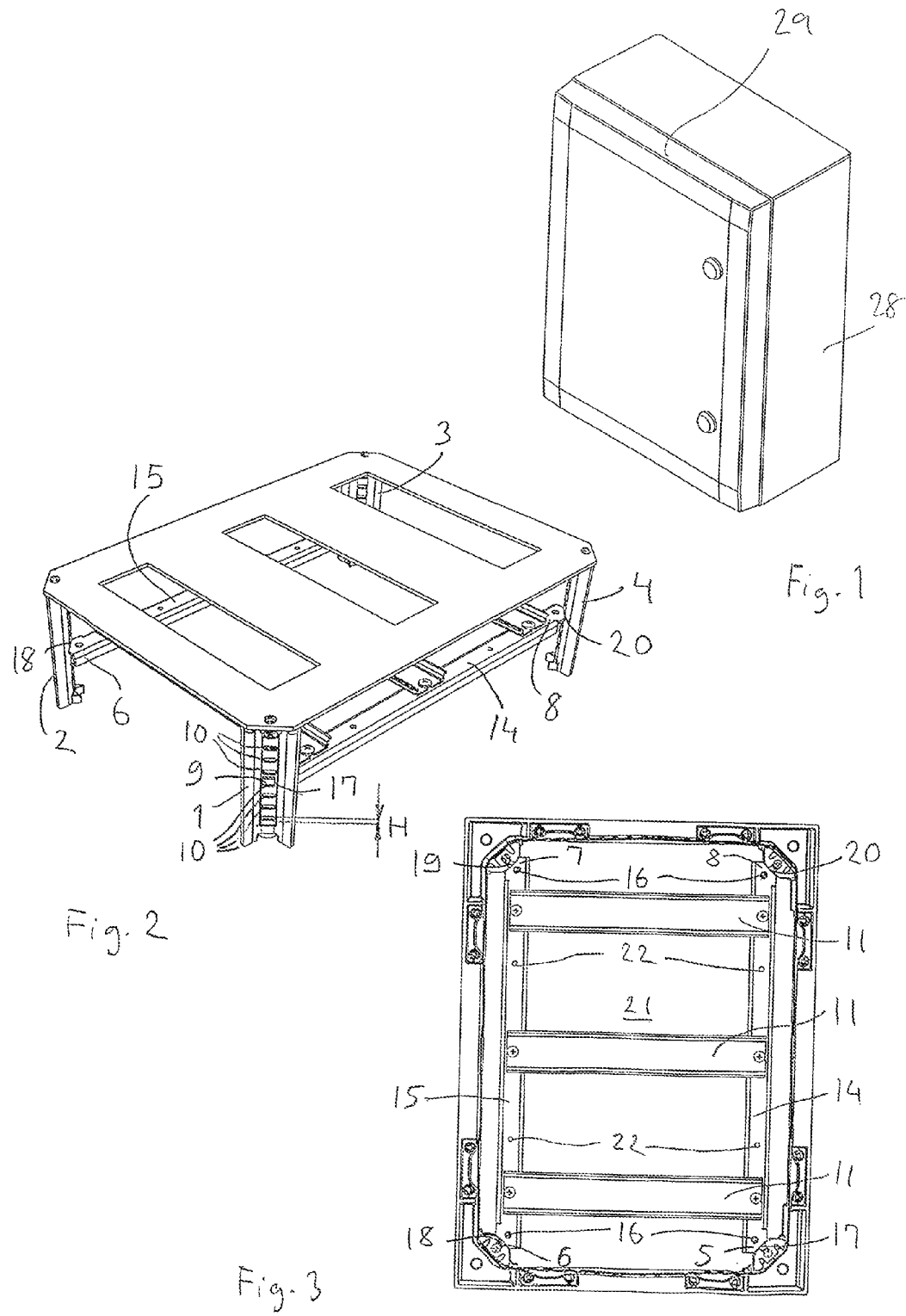

MOUNTING FRAME AND RAIL FOR ELECTRONICS AND INSTRUMENTATION ENCLOSURE

BACKGROUND OF THE INVENTION

The invention relates to a mounting frame for an electronics and instrumentation enclosure for supporting components and parts to be mounted into the electronics and instrumentation enclosure, the mounting frame comprising two elongated parallel supports that form two sides of the mounting frame and are interconnected by an elongated piece, and four elongated corner parts fastened to the ends of the elongated supports by fastening means so that each end is provided one corner part and the corner parts are perpendicular to a plane defined by the supports, the corner parts being positioned in relation to one another so that they are at the corners of a rectangle, which rectangle has been obtained by joining the corner parts together with four straight lines. Said rectangle is an imaginary rectangle formed by joining four imaginary straight lines.

The invention also relates to an elongated support for a mounting frame of an electronics and instrumentation enclosure, the support forming a side of the mounting frame and also a mounting base for supporting the components and parts to be installed, the support comprising a fastening member at its opposite ends for fastening to an elongated corner part of the mounting frame which is perpendicular to the mounting base and to a longitudinal direction of the elongated support, the corner part comprising a mounting hole for receiving the fastening member.

A mounting frame and an elongated support of the above type are known from patent publication FI 116028B. A problem with the mounting frame and support of FI 116028B, for example, is that the assembly of the mounting frame and its mounting inside an electronics and instrumentation enclosure is slow and requires the use of many parts, such as a number of screws. The elongated supports are fastened to the corner parts with screws, as disclosed in the solution of FI 116028B, although prior art also knows fastening by separate intermediate parts. The mounting frame is often mounted in place at the site of use of the enclosure and therefore there is a risk that small loose parts, such as corner parts, intermediate pieces and screws, in particular, get lost. If the enclosure is mounted to a vertical wall, as is common, the possibility of parts being lost is particularly great. If the mounting is to be performed at a sub-zero temperature, it may be extremely laborious because the tools, such as screw drivers, may be difficult to use.

BRIEF DESCRIPTION OF THE INVENTION

An object of the invention is to provide a mounting frame for an electronics and instrumentation enclosure that is particularly easy and rapid to mount inside the electronics and instrumentation enclosure. To achieve this, the mounting frame of the invention comprises two elongated parallel supports that form two sides of the mounting frame and are interconnected by an elongated piece, and four elongated corner parts fastened to the ends of the elongated supports by fastening means so that each end is provided with one corner part and the corner parts are perpendicular to a plane defined by the elongated supports, the corner parts being positioned in relation to one another so that they are at the corners of a rectangle, which rectangle has been obtained by joining the corner parts with four straight lines, wherein the fastening means comprise a locking tongue formed to the ends of the elongated supports, each opposite end of both elongated supports having a locking tongue formed as one piece with the longitudinal support and extending away from the plane defined by the elongated supports; and a through-hole for mounting arranged to the corner part for receiving the locking tongue, the corner parts comprising a plural number of such mounting holes at a distance from one another in a longitudinal direction of the corner parts;

the locking tongue is inside the mounting hole without clearance when the longitudinal direction of the corner part is perpendicular to the plane defined by the supports; and the locking tongue comprises a support surface directed towards the corner parts at an angle of 70 to 100 degrees to the plane defined by the elongated supports.

The length of the locking tongue is preferably greater than the height of the mounting hole and thus the corner parts do not detach from the support easily when the locking tongues are in the mounting holes of the corner parts.

When the locking tongue is in the mounting hole, the corner part is preferably turnable to the longitudinal direction of the support, the locking tongue being sufficiently thick to cause the locking tongue to press against the wall of the mounting hole when the locking tongue is being turned in the mounting hole. The pressing force ensures that the tongue stays in place in the mounting hole without coming off from the mounting hole when the frame is turned irrespective of the position to which the mounting frame is turned during mounting. Because of the pressing force, the mounting frame is self-bracing, in a way, and keeps a specific geometry when put in place into the enclosure, after which its fastening to the enclosure can be ensured, if desired, by fastening members.

The locking tongue is preferably sufficiently thick to cause the locking tongue to press against the wall of the mounting hole when the corner part is turned to an acute angle in relation to the longitudinal direction of the support and to the plane defined by the elongated supports. This type of solution provides a particularly easy means for mounting the corner part in place to the elongated support. Moreover, the locking tongue is preferably not subjected to pressing when the locking tongue is in the mounting hole and the corner parts are perpendicular to the plane defined by the supports. This type of solution makes it possible to freely turn slightly the corner part without resistance for positioning the corner part precisely to a desired angle in relation to a mounting plane defined by the support and a plane defined by the supports and in view of the mounting in place of the mounting frame, making it thus particularly easy to set the mounting frame in place towards the bottom of the enclosure along guides provided at the corners of the enclosure, without the plane defined by the elongated supports of the mounting frame having to be fully parallel with the bottom plane of the enclosure. When the mounting frame is lowered down, the corner parts may thus slightly turn so that they become precisely parallel with the guides at the corners of the enclosure.

The preferred embodiments of the mounting frame according to the invention are disclosed in the attached claims.

The major advantage of a mounting frame of the invention is that the frame is easy and rapid to install into an electronics and instrumentation enclosure also at the installation site. In addition, the mounting frame essentially decreases the risk of parts, such as screws, needed in the mounting being lost.

The elongated support of the invention is defined as an elongated support for a mounting frame of an electronics and instrumentation enclosure, the support forming a side of the mounting frame and also a mounting plane for supporting components and parts to be mounted, and the elongated support comprising a fastening member at opposite ends thereof to be fastened to an elongated corner part provided in the mounting frame and perpendicular to the mounting plane and to a longitudinal direction of the elongated support, the corner part comprising a mounting hole for receiving the fastening member, wherein the fastening member of the elongated support is a locking tongue formed as one piece with the elongated support and extending away from the mounting plane defined by the elongated support.

The major advantage of an elongated support of the invention is that it enables a mounting frame to be provided that is easy and rapid to assemble and to install into an electronics and instrumentation enclosure also at the installation site. Because the elongated support comprises a locking tongue, no loose fastening means are need for fastening the elongated support to a corner part of the mounting frame, the elongated support essentially decreasing the risk of parts, such as screws, needed in the mounting being lost.

BRIEF DESCRIPTION OF THE DRAWINGS

In the following, the invention will be explained in greater detail in connection with the preferred embodiments and with reference to the attached drawing, in which:

FIG. 1 is a perspective view of an electronics and instrumentation enclosure with a mounting frame of the invention inside it;

FIG. 2 is a perspective view of the mounting frame inside the enclosure of FIG. 1, with a shield against contact provided on the mounting frame;

FIG. 3 shows the enclosure of FIG. 1 without a cover when the inside of the enclosure is seen from above/the front, thus disclosing the mounting frame inside the enclosure, for illustrating the mounting frame, but not the shield against contact of FIG. 2;

DETAILED DESCRIPTION OF THE INVENTION

Figure 4:
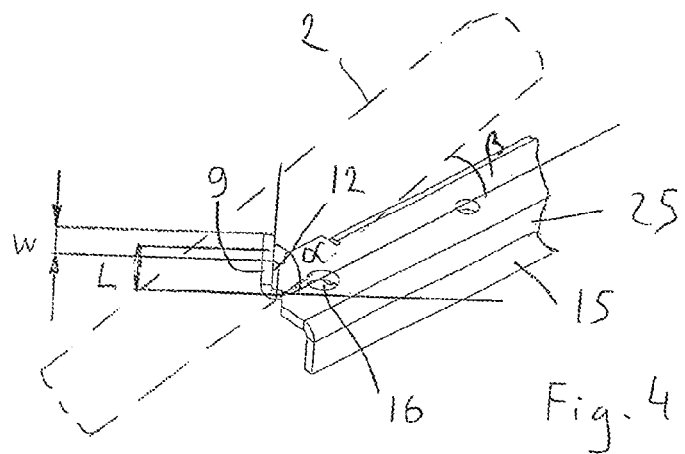
FIGS. 4 and 5 show an end of the elongated support of the mounting frame of FIG. 2 from two different angles.

FIG. 1 shows an electronics and instrumentation enclosure (hereinafter "enclosure" for shortness), inside of which there is a mounting frame for supporting components and parts to be mounted into the enclosure. The enclosure comprises a bottom part 28 and a cover 29.

FIG. 2 shows a mounting frame with a shield against contact 13 fastened on top of it. The mounting frame comprises elongated parallel supports 14 and 15 interconnected by three parallel elongated pieces 11. The elongated pieces are DIN rails (e.g. DIN-35 or DIN-15), although other types of mounting rail alternatives are possible. The number of the elongated pieces 11 may vary, but at least one must be provided to achieve an assembly in which the supports 14, 15 are at a desired distance from one another. The supports 14, 15 form two sides of the mounting frame. In addition, the mounting frame comprises four elongated corner parts 1 to 4, which are perpendicular to a plane defined by the supports 14, 15. The corner parts 1 to 4 are fastened to the ends of the supports 14, 15 by fastening means 17 to 20. If the corner parts 1 to 4 are interconnected by imaginary straight lines where the adjacent ones are at a right angle to each other, an imaginary rectangle is obtained. In other words, the rectangle is formed by joining adjacent corner parts by straight lines.

The fastening means 17 to 20 comprise locking tongues 9 formed at the ends 5 to 8 of the supports. The locking tongue 9 is at a right angle α to the plane defined by the supports 14, 15, see FIGS. 4 and 5 that show an end of the support 15. The range of angle α may be 70 to 100 degrees, although most preferably about 90 degrees. In addition to FIGS. 4 and 5, the locking tongue 9 is also shown in FIG. 2 where the locking tongue is installed into a mounting hole 10 of a corner part 1. The mounting hole is a through-hole. The corner parts 1 to 4 comprise a plural number of mounting holes 10 arranged at a small distance from one another in the longitudinal direction of the corner parts. The mounting holes 10 are equally spaced. The distance between adjacent mounting holes 10 is small, for example 5 to 15 mm. The mounting holes 10 allow the supports 14, 15 to be mounted to different heights inside the enclosure.

Figure 5:
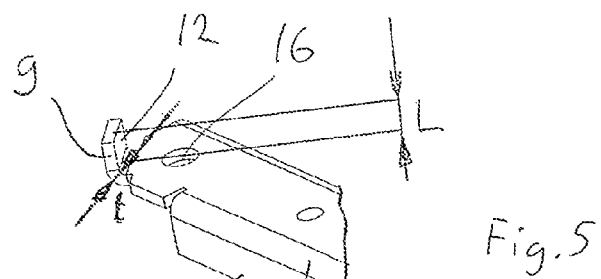

Although FIGS. 4 and 5 show that the locking tongue 9 extends upward from the top surface of the support 15, which is the mounting plane of the support, i.e. upward from the mounting plane defined by the supports 14 and 15 of FIG. 2, the locking tongue 9 could alternatively extend downward from the top surface of the support 15 and from the mounting plane defined by the supports 14 and 15. When the locking tongue 9 extends upward, the mounting frame is easier to move and install into the enclosure compared to a locking tongue that is downward directed. When the locking tongue 9 is upward directed, the corner part 2 (depicted by a broken line in FIG. 4) is prevented from turning so that angle β formed in FIG. 4 would be an obtuse angle, because a support surface 12 of the locking tongue 9 sets against a surface of the corner part 2 when angle β is about 90 degrees. However, the corner part 2 may turn to form an acute angle β to the longitudinal direction of the support 15 and to the plane defined by the supports 14, 15.

The length L (see FIGS. 4 and 5) of the locking tongue 9 is greater than the height H (see FIGS. 2 and 6) of the mounting hole 10. The length L refers to the height of the locking tongue 9 when the locking tongue extends upward, as in FIGS. 4 and 5. If the locking tongue 9 extended downward (which is a possible implementation alternative), reference could not be made to a locking tongue "height" but rather to its "length". For this reason, the expression "locking tongue length L" is used in this context also for the implementation of FIG. 4.

Figure 6:
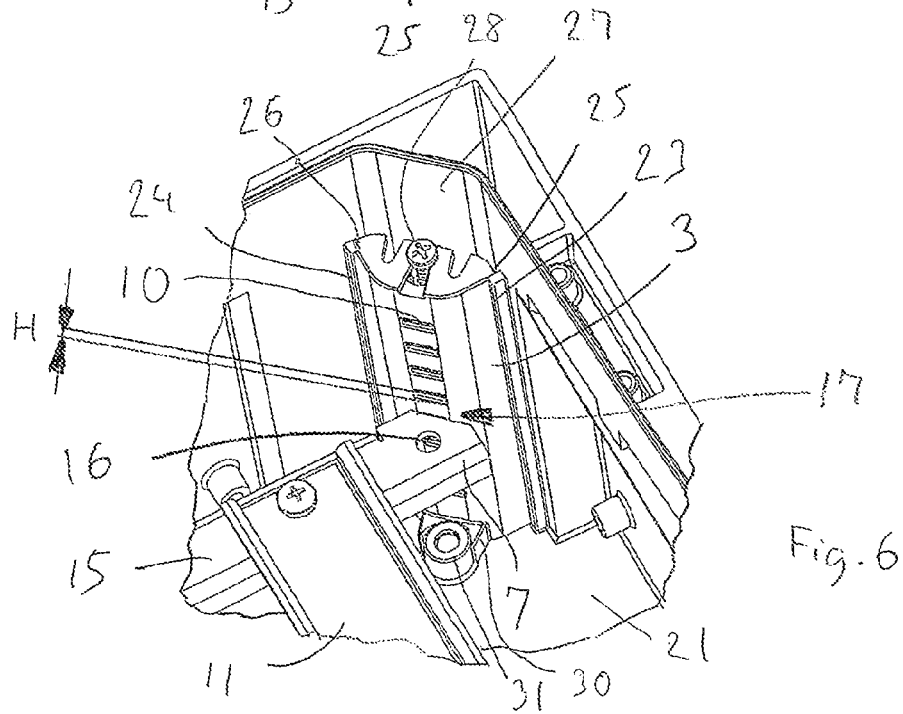
FIG. 6 shows the fastening of a corner part of the mounting frame to a corner of the enclosure.

A dimension of the locking tongue 9, mainly its thickness t in the thickest part of the locking tongue, is slightly greater than the height H of the mounting hole 10, the locking tongue 9 thus pressing against the wall of the mounting hole 10 when the corner part 2 is turned to an acute angle β in relation to the mounting plane defined by the support 15 (and to the plane defined by the supports 14, 15). Angle β is about 70 degrees, for example, when said pressing takes place, although it is conceivable that angle β may be in the range of 20 to 80 degrees. When angle β is small, for example 0 to 20 degrees, the locking tongue 10 may be placed into the mounting hole 10 without a counter force, but when the corner part 2 is turned to an increasingly greater angle β in relation to the support 15, at some point the locking tongue 9, at an angle β value of 60 degrees, for example, starts to press against the wall of the mounting hole 10, and when the turning of the corner part continues (in relation to the support 15), said pressing increases to its maximum value, e.g. at an angle β value of 70 degrees, and when the turning continues, the pressing stops or is at least reduced at an angle β value of 80 degrees, for example. When the turning continues further still and angle β reaches a value exceeding 85 degrees, for example, the wall of the mounting hole 10 no longer presses the locking tongue 9. When the corner part 2 is at a right angle to the support 15 (i.e. angle β=about 90 degrees), the support surface 12 of the locking tongue 9 sets towards the corner part 2 and the corner part cannot be turned to an angle β value that would exceed about 90 degrees. The fact that angle β cannot obtain a value exceeding about 90 degrees enables to eliminate a situation in which the bottom ends of the corner parts 1 to 4 of the mounting frame of FIG. 2 would turn downward in the mounting frame, which would make it difficult to the set them into co-operation with the guide rails or other runners at the enclosure corners for lowering the mounting frame into the enclosure. The guide rails are shown in FIG. 6, which depicts a corner of the mounting frame. In FIG. 6 the corner part 3 is in place against the bottom 21 of the enclosure where it has been positioned guided by guide rails 23, 24 provided at the corners of the enclosure. Sides 25, 26 of the corner part 3 rest on the guide rails 23, 24 when the corner part 3 is moved towards the bottom of the enclosure. The corner part 3 also rests on a wall 27 of the enclosure when the corner part is being taken in place. Also the guide rails 23, 24 keep the corner part 3 in place after the corner part 3 has been mounted in place in the position shown in FIG. 6. The bottom end of the corner part 3 is provided with a lug 30 that sets against a protrusion 31 at the bottom 21. The lug 30 and the protrusion 31 are not indispensable, but they assist in keeping the corner part 3 in the correct position even if the enclosure was subjected to strong impacts. If desired, screws 28 or other similar fastening means are used to ensure that the mounting frame with its corner parts 1 to 4 stays in place at the bottom 28 of the enclosure.

It is conceivable to provide the above-described pressing of the locking tongue 9 of the support 5 against the wall of the mounting hole 10 differently from what is disclose above by forming a dimension of the locking tongue in a width direction, mainly by selecting for the locking tongue a width w which makes the locking tongue press to the wall of the mounting hole at a specific value of angle β (c.f. angle β described above). The loosening or ceasing of the pressing of the locking tongue 9 may be implemented in this type of solution similarly as described above.

When the corner parts 1 to 4 are at the position of FIG. 2, i.e. perpendicularly to the plane defined by the supports 14, 15, the locking tongues 9 of the supports are in the mounting holes of the corner parts substantially without a clearance, which contributes to reducing the movement of the corner parts 1 to 4 and their shifting in relation to the supports 14, 15. This is advantageous when the mounting frame is mounted in place inside the enclosure.

As seen in FIGS. 3 to 6, the elongated supports 14, 15 comprise through-holes 16 at their ends 5 to 8. The holes 16 are meant to enable the screwing of the supports 14, 15 without the corner parts 1 to 4 to the bottom 21, if this is desired. In that case the supports 14, 15 set very close to the bottom 21 of the enclosure. The supports 14, 15 are also provided with fastening holes 22 at a distance from one another in the longitudinal direction of the supports. The fastening holes 22 allow the elongated pieces 11 (DIN rails) to be fastened to different points of the mounting frame.

It is recommended to make the elongated supports 14, 15 of steel as this allows the locking tongues 9 at the ends of the supports 14, 15 to be directed away (upward or downward) from the plane defined by the supports by bending them to a desired angle α (see angle α of FIG. 4). The locking tongues 9 are formed as one piece with the supports 14, 15 (the tongues being one part with the supports) and they may be said to be integrated with the supports. For reinforcing the supports 14, 15, they are chamfered so that they have a bend 25 in their longitudinal direction.

The invention is described above with reference to only one of its preferred embodiments and it is to be noted that the details of the invention may be implemented in various ways within the scope of the accompanying claims. Hence the detailed shaping of the locking tongue, for example, may differ from the shape shown in the Figures; the shape of the mounting hole may differ from the shape shown in the figures; the shape of the profile of the elongated supports may differ from the shape shown in the figure; and the shaping of the corner part may differ from the shape shown in the figures and their fastening to the enclosure may be implemented in another manner than what is disclosed in the figure.

The invention claimed is:

1. A mounting frame for an electronics and instrumentation enclosure for supporting components and parts to be mounted into the electronics and instrumentation enclosure, the mounting frame comprising two elongated parallel supports that form two sides of the mounting frame and are interconnected by an elongated piece, and four elongated corner parts fastened to the ends of the elongated supports by a fastener so that each end is provided with one corner part and the corner parts are perpendicular to a plane defined by the elongated supports, the corner parts being positioned in relation to one another so that they are at the corners of a rectangle, which rectangle has been obtained by joining the corner parts with four straight lines, wherein the fastener comprises a locking tongue formed to the ends of the elongated supports, each opposite end of both elongated supports having a locking tongue formed as one piece with the elongated support and extending away at an angle of 70 to 100 degrees from the plane defined by the elongated supports; and a through-hole for mounting arranged to the corner part for receiving the locking tongue, the corner parts comprising a plural number of such mounting holes at a distance from one another in a longitudinal direction of the corner parts;

the locking tongue is inside one mounting hole of said plurality of mounting holes substantially without clearance between the locking tongue and a wall defining said one mounting hole when the longitudinal direction of the corner part is perpendicular to the plane defined by the supports; and the locking tongue has a length that is greater than a height of said one mounting hole, said length being the height of the locking tongue when the locking tongue extends upward or being the length of the locking tongue when the locking tongue extends downward, and the locking tongue comprises a support surface directed towards the corner parts.

2. A mounting frame as claimed in claim 1, wherein the corner part is turnable in relation to the longitudinal direction of the support when the locking tongue is in the mounting hole and the locking tongue has a thickness that is sufficiently great to cause the locking tongue to press against the wall of the mounting hole when the locking tongue is being turned in the mounting hole.

3. A mounting frame as claimed in claim 2, wherein the thickness of the locking tongue is sufficiently great to cause the locking tongue to press against the wall of the mounting hole when the corner part is turned to an acute angle in relation to the longitudinal direction of the support and to the plane defined by the supports.

4. A mounting frame as claimed in claim 1, wherein the corner part is turnable in relation to the longitudinal direction of the support when the locking tongue is in the mounting hole and the locking tongue has a width that is sufficiently great to cause the locking tongue to press against the wall of the mounting hole when the locking tongue is in the mounting hole.

5. A mounting frame as claimed in claim 4, wherein the width of the locking tongue is sufficiently great to cause the locking tongue to press against the wall of the mounting hole when the corner part is turned to an acute angle in relation to the longitudinal direction of the support and to the plane defined by the supports.

6. A mounting frame as claimed in claim 5, wherein said acute angle is 20 to 80 degrees.

7. A mounting frame as claimed in claim 2, wherein the locking tongue is not subjected to pressing by the wall of the mounting hole when the locking tongue is mounted into the mounting hole and the corner parts are perpendicular to the plane defined by the parallel supports.

8. A mounting frame as claimed in claim 1, wherein the elongated piece is a DIN rail according to DIN-35 or DIN-15.

9. A mounting frame as claimed in claim 1, wherein the corner part is turnable in relation to the longitudinal direction of the support when the locking tongue is in the mounting hole and the locking tongue has a thickness that is sufficiently great to cause the locking tongue to press against the wall of the mounting hole when the locking tongue is being turned in the mounting hole.

10. A mounting frame as claimed in claim 1, wherein the corner part is turnable in relation to the longitudinal direction of the support when the locking tongue is in the mounting hole and the locking tongue has a width that is sufficiently great to cause the locking tongue to press against the wall of the mounting hole when the locking tongue is in the mounting hole.

11. A mounting frame as claimed in claim 2, wherein the corner part is turnable in relation to the longitudinal direction of the support when the locking tongue is in the mounting hole and the locking tongue has a width that is sufficiently great to cause the locking tongue to press against the wall of the mounting hole when the locking tongue is in the mounting hole.

12. A mounting frame as claimed in claim 3, wherein the corner part is turnable in relation to the longitudinal direction of the support when the locking tongue is in the mounting hole and the locking tongue has a width that is sufficiently great to cause the locking tongue to press against the wall of the mounting hole when the locking tongue is in the mounting hole.

13. A mounting frame as claimed in claim 3, wherein said acute angle is 20 to 80 degrees.

14. A mounting frame as claimed in claim 4, wherein the locking tongue is not subjected to pressing by the wall of the mounting hole when the locking tongue is mounted into the mounting hole and the corner parts are perpendicular to the plane defined by the parallel supports.

15. A mounting frame as claimed in claim 1, wherein the elongated piece is a DIN rail according to DIN-35 or DIN-15.

16. A mounting frame as claimed in claim 2, wherein the elongated piece is a DIN rail according to DIN-35 or DIN-15.

17. A mounting frame as claimed in claim 3, wherein the elongated piece is a DIN rail according to DIN-35 or DIN-15.

* * * * *